(12) United States Patent
Kong et al.

(10) Patent No.: US 11,527,962 B2
(45) Date of Patent: Dec. 13, 2022

(54) POWER ADAPTER HAVING ULTRA LOW STANDBY POWER

(71) Applicant: DIALOG SEMICONDUCTOR INC., Campbell, CA (US)

(72) Inventors: Pengju Kong, Campbell, CA (US); Wenduo Liu, Campbell, CA (US); Yong Xiong Lin, Campbell, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 108 days.

(21) Appl. No.: 17/020,635

(22) Filed: Sep. 14, 2020

(65) Prior Publication Data

US 2022/0085726 A1     Mar. 17, 2022

(51) Int. Cl.
| | |
|---|---|
| H02M 3/335 | (2006.01) |
| H03K 5/24 | (2006.01) |
| G01R 19/165 | (2006.01) |
| H04B 10/80 | (2013.01) |
| H02J 7/00 | (2006.01) |
| H02J 7/06 | (2006.01) |
| H03K 17/795 | (2006.01) |
| H02M 1/00 | (2006.01) |

(52) U.S. Cl.
CPC .. *H02M 3/33592* (2013.01); *G01R 19/16538* (2013.01); *H02J 7/0036* (2013.01); *H02J 7/06* (2013.01); *H03K 5/24* (2013.01); *H03K 17/7955* (2013.01); *H04B 10/802* (2013.01); *H02M 1/0025* (2021.05); *H02M 1/0032* (2021.05)

(58) Field of Classification Search
CPC ......... H02M 3/33507; H02M 3/33561; H02M 3/33569; H02M 3/33576; H02M 3/33592; H02M 1/0025; H02M 1/0032; G01R 19/16538; H02J 7/0036; H02J 7/06; H03K 5/24; H03K 17/7955; H04B 10/802
USPC ..................................... 361/21.14
See application file for complete search history.

(56) References Cited

U.S. PATENT DOCUMENTS

| | | | | |
|---|---|---|---|---|
| 2011/0012578 A1* | 1/2011 | Capilla | ............... | H02M 3/1588 323/283 |
| 2011/0255311 A1* | 10/2011 | Hsu | ................... | H02M 3/33507 363/21.15 |
| 2017/0302185 A1* | 10/2017 | Tao | ................... | H02M 3/33592 |
| 2019/0356231 A1* | 11/2019 | Radic | ................ | H02M 3/33576 |
| 2021/0376742 A1* | 12/2021 | Liu | ................... | H02M 3/33576 |

FOREIGN PATENT DOCUMENTS

WO    WO-2017099768 A1  *  6/2017

* cited by examiner

*Primary Examiner* — Yemane Mehari
(74) *Attorney, Agent, or Firm* — Haynes and Boone, LLP (57) ABSTRACT

A standby power system for a flyback converter is disclosed. The flyback converter includes a primary-side, a secondary-side, an output terminal at the secondary-side, and a secondary-side controller, where the output terminal is configured to electrically connect to a load. The standby power system comprises a comparator at the secondary-side, an opto-coupler in signal communication with the primary-side, the secondary-side, and the comparator, and a cable detach detector (or load detector). The cable detach detector is configured to determine whether a device is electrically connected to the flyback converter through a charging cable and to set the flyback converter into a standby mode if the deice is disconnected from the charging cable.

20 Claims, 5 Drawing Sheets

POWER ADAPTER HAVING ULTRA LOW STANDBY POWER

TECHNICAL FIELD

This application relates to switching power converters, and more particularly to systems for lowering the power consumption of switching power converters in a standby mode.

BACKGROUND

A flyback converter such as for charging batteries of mobile devices includes a feedback loop for regulating an output voltage in both a normal mode of operation and a standby mode of operation. In both modes of operations, the flyback converter is connected to an AC power line (i.e., the AC mains). In the normal mode of operation, the mobile device is connected to the flyback converter. But in the standby mode of operation, the flyback converter is disconnected from the mobile device (e.g., a smartphone). To regulate the output voltage in both these modes of operation, the flyback converter includes a feedback loop having an error amplifier that generates an error voltage based upon a difference between the output voltage and a desired value for the output voltage. A loop filter filters the error voltage to produce a control voltage. Since the feedback loop must be active during the standby mode to regulate the output voltage, the flyback converter still consumes power during the standby mode that is commonly referred to as standby power or as standby losses.

To reduce standby losses, prior art methods generally focus on reducing the integrated circuit (IC) current. When a no-load condition is detected by the flyback converter, known approaches include reducing the IC quiescent current by shutting down various functional blocks of circuitry. However, the feedback loop has to remain on, which consumes most of the power during standby mode of operation. Further, in embodiments in which the control voltage is generated on the secondary side of the flyback converter and transmitted across an opto-coupler, the opto-coupler then conducts a continuous current, which also increases loss.

Accordingly, there is a need in the art for flyback converters with reduced power consumption during the standby mode.

SUMMARY

To provide reduced standby mode power consumption, a standby power system is provided that may implemented on either side (or both sides) of a flyback converter's transformer. The standby power system uses a comparator to control the switching of the power switch transistor after a cable detach detector triggers the standby mode of operation. The cable detach detector is configured to determine whether a device (for example, a mobile device or a wireless charger for a mobile device) is electrically connected to the flyback converter through a charging interface such as a USB cable or a lightning cable such as by monitoring a data channel in the charging interface. Should the cable detach detector detect that the device is disconnected, the cable detach detector sets the flyback converter into a standby mode of operation in which a feedback loop for a normal mode of operation is powered down. For example, the cable detach detector triggers the powering down of an error amplifier and a loop filter in the feedback loop in response to the disconnection of the device. In alternative embodiments, the cable detach detector may be replaced by a load detector that determines whether a device is applying a load. Should the load detector detect that the load is absent or below a threshold load level, the load detector sets the flyback converter into the standby mode of operation.

In embodiments in which the comparator is a secondary-side comparator, the secondary-side comparator functions during the standby mode to compare a flyback converter output voltage against a threshold voltage. Should the secondary-side comparator detect that the output voltage is lower than the threshold voltage, the secondary-side comparator drives a digital signal through a ground-isolating channel. For example, the secondary-side comparator may cause a current to flow through a photodiode in an opto-coupler. But if the output voltage is greater than the threshold voltage, no current flows in the opto-coupler. In response to the photodiode current, a primary-side controller triggers a power switch transistor to cycle to charge the output voltage. Since there is no load during the standby mode, the output voltage will very quickly charge above the threshold voltage. The duty cycle for the signaling through the opto-coupler is thus relatively small as it conducts no current except for the relatively-short periods of time during which the output voltage is less than the threshold voltage.

A primary-side comparator may be used in lieu of the secondary-side comparator or in combination with the secondary-side comparator. A cable detach detector (or a load detector) remains on the secondary-side to signal the standby power system through (for example) an opto-isolator that a device is disconnected from the charging cable. In response to this detection, a normal mode feedback loop is powered down. A primary-side controller is powered by a power supply voltage developed by an auxiliary winding in the flyback converter's transformer. To maintain the output voltage in regulation, the primary-side comparator compares the power supply voltage to a threshold voltage. The power supply voltage thus acts as a proxy for the output voltage with respect to the regulation by the primary-side comparator. Should the power supply voltage drop below the threshold voltage, the primary-side comparator causes the power switch transistor to cycle on until a desired peak primary current is reached. The resulting standby mode is thus advantageously very-low power in that the primary-side comparator does not trigger any opto-coupler signaling.

These and other aspects of the invention will become more fully understood upon a review of the detailed description, which follows. Other aspects, features, and embodiments will become apparent to those of ordinary skill in the art, upon reviewing the following description of specific, exemplary embodiments in conjunction with the accompanying figures. While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

The invention may be better understood by referring to the following figures. Embodiments of the present disclosure and their advantages are best understood by referring to the detailed description that follows. The components in the figures are not necessarily to scale, emphasis instead being placed upon illustrating the principles of the invention. In the figures, like reference numerals designate corresponding parts throughout the different views.

DETAILED DESCRIPTION

To provide reduced standby mode power consumption, a standby power system is provided that includes a secondary-side comparator and/or a primary-side comparator. A cable detach detector functions to determine whether a device (e.g, a mobile device such as a smartphone or a wireless charger for a mobile device) is electrically connected to the flyback converter through a charging interface to a charging cable such as a USB cable or a lightning cable by, for example, monitoring a data channel in the charging interface. In alternative embodiments, the cable detach detector may be replaced by a load detector that detects whether the device is drawing a load. Should the cable detach detector detect that the device is disconnected, the cable detach detector sets the flyback converter into a standby mode of operation in which a feedback loop for a normal mode of operation is powered down. For example, the cable detach detector triggers the powering down of an error amplifier and a loop filter in the feedback loop in response to the disconnection of the device. As used herein, the term "device" refers to a mobile device or a wireless charger for a mobile device. The load detector functions similarly to set the flyback converter into the standby mode in response to detecting that a load is either absent or below a threshold load value.

A standby power system with a secondary-side comparator will be discussed first followed by a discussion of a standby power system with a primary-side comparator. But it will be appreciated that a standby power system may include both a primary-side and a secondary-side comparator. As compared to the feedback loop used during the normal mode of operation, a comparator consumes relatively little power such that "zero standby power" (a standby power consumption of 5 mW or less) is readily achieved. In contrast, a conventional standby mode power consumption does not provide zero standby power because the standby power consumption of the feedback loop and associated circuitry exceeds 5 mW.

The feedback loop during the normal mode of operation uses (for example) an error amplifier and a loop filter to generate a control voltage. If the control voltage is generated on the secondary side of the flyback converter, the flyback converter may be deemed to use secondary-side regulation. In the normal mode of operation, the secondary-side controller regulates the output voltage from the output terminal by sending an analog signal representing the control voltage through the opto-coupler to the primary-side of the flyback converter. A primary-side controller receives the analog signal and uses it as an input to control the cycling of the power switch transistor. Note that this control signal communication has a 100% duty cycle. This is problematic for conventional standby modes of operation that use the feedback loop to regulate the output voltage as the opto-coupler constantly burns power.

But in the standby mode of operation disclosed herein with secondary-side regulation, the secondary-side comparator monitors the output voltage to send a digital (ON/OFF) signal through the opto-coupler. The digital signal is generated by the secondary-side comparator by comparing the output voltage to a threshold voltage. When the output voltage drops below the threshold voltage, the secondary-side comparator switches on a current through the photodiode in the opto-coupler (the ON portion of the digital signal). But when the output voltage is greater than the threshold voltage, the secondary-side comparator switches off the photodiode current (the OFF portion of the digital signal). In general, the threshold voltage is preset or defined such that a power supply voltage for the secondary-side controller is greater than an under-voltage lock out (UVLO) value. The UVLO value is the voltage necessary to maintain an integrated circuit (IC) functional to respond to a re-connection of a device to the flyback converter's charging interface. This allows the flyback converter to exit the standby mode almost immediately and resume the normal mode of operation.

The ON digital signal transmitted through the opto-coupler is received by the primary-side portion of the standby power system so that the primary-side portion may the cycle the power switch transistor. For example, the primary-side portion may switch on the power switch transistor until a primary current as measured by the voltage across a sense resistor exceeds a voltage corresponding to a desired peak primary current. When the primary-side portion senses that the peak primary current has been achieved, it switches off the power switch transistor. The resulting power that is transferred to the secondary side of the flyback converter rapidly increases the output voltage since there is no load during the standby mode of operation. The secondary-side comparator then reacts to the output voltage exceeding the threshold voltage by switching the photodiode current off. The ON portion of the digital signal transmitted by the opto-coupler thus has a relatively small duty cycle. For example, in one embodiment, the ON portion of the digital signal may be 200 to 400 microseconds whereas the OFF portion is approximately 0.5 second. This very low duty cycle results in relatively little power being consumed by the opto-coupler. In other embodiments, the opto-coupler may be replaced by other types of ground-isolating channels such as a signal transformer or a capacitor. But regardless of how the ground-isolating channel is implemented, the secondary-side comparator will advantageously drive the ground-isolating channel with a relatively low duty cycle digital ON/OFF signal so that standby power is conserved. The following discussion will be directed to embodiments in which the ground-isolating channel is an opto-coupler without loss of generality. The charging cable may be a universal serial bus (USB) power adapter or a lightning cable.

Figure 1A:
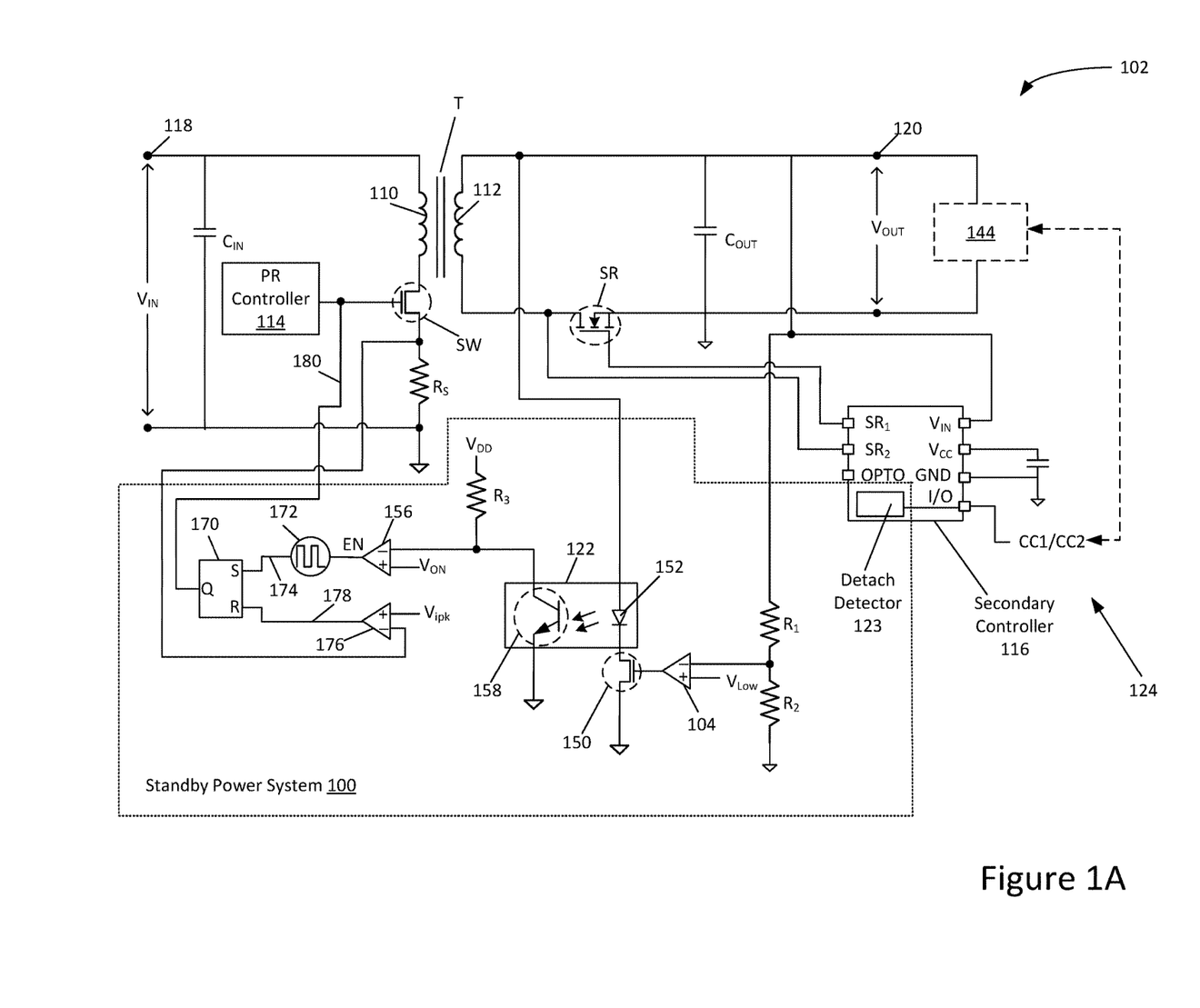
FIG. 1A illustrates a system block diagram of a standby power system for a flyback converter utilizing a comparator on a secondary-side of the flyback converter in accordance with an aspect of the disclosure.

An example flyback converter 103 is shown in FIG. 1A with secondary-side regulation and a standby power system 100 including a secondary-side comparator 104 in accordance with the present disclosure. The flyback converter 102 includes a transformer T having a primary-side winding 110 and a secondary-side winding 112. The primary winding 110 is in series with a primary-side power switch transistor SW. During a normal mode of operation, a primary-side controller 114 drives a gate of the power switch transistor SW to control a cycling of the power switch transistor SW responsive to a control current transmitted by a secondary-side controller 116 through an opto-coupler 122 as driven through an opto-coupler (OPTO) terminal. Secondary-side controller 116 may also function as a synchronous rectifier (SR) controller to control the cycling of an SR switch transistor. In alternative embodiments, the SR switch transistor may be replaced by an output diode to rectify the secondary-side current.

A rectified input voltage $V_{IN}$ such as produced by a diode bridge rectification of an AC mains is received at an input terminal 118 and filtered by an input capacitor $C_{IN}$ to drive a primary winding current through the power switch transistor SW when the power switch transistor SW is switched on. While the power switch transistor SW conducts, the SR switch transistor is maintained off. When a desired peak primary winding current is reached as detected through a voltage across a sense resistor $R_S$ coupled between a source of the power switch transistor SW and ground, the power switch transistor SW is cycled off and the SR switch transistor is cycled on so that a secondary winding current flows to produce an output voltage ($V_{OUT}$) at an output terminal 120 as supported by an output capacitor $C_{OUT}$.

A cable detach detector 123 monitors a data channel (e.g., the CC1/CC2 pins in a USB interface 124) to determine whether a device 144 is electrically connected to the USB cable (or other suitable charging interface) and sets the flyback converter 102 into a standby mode if the device 144 is disconnected. In this example, the cable detach detector 123 may be implemented as part of the secondary-side controller 116 that includes an input/output (I/O) terminal for connection to the data channel in the charging interface for charging the device 144.

During the standby mode, the secondary-side comparator 104 receives the output voltage $V_{OUT}$ such as through a voltage divider that includes a first resistor $R_1$, second resistor $R_2$, and ground. An output terminal of the secondary-side comparator 104 drives a gate of transistor 150 that is in series with a photodiode 152 in the opto-coupler 122. The secondary-side comparator 104 compares the output voltage $V_{OUT}$ as scaled down through the voltage divider to a threshold voltage ($V_{LOW}$). Should the scaled down version of $V_{OUT}$ be greater than $V_{LOW}$, the secondary-side comparator 104 shuts off transistor 150 so that opto-coupler 122 consumes no power. But if the scaled down version of $V_{OUT}$ is less than $V_{LOW}$, the secondary-side comparator 104 switches on the transistor 150 to permit the photodiode current to conduct. The following discussion will deem the secondary-side comparator 104 to directly compare the output voltage to the threshold voltage although it will be appreciated that such a comparison may be indirect such as by a comparison of the scaled down version of the output voltage. Since the photodiode 152 couples between the output terminal 120 and transistor 150, the output voltage drives a photodiode current through the photodiode 152 when the transistor 150 conducts.

The opto-coupler 122 may thus be deemed to be transmitting a digital ON/OFF signal that is ON when the secondary-side comparator 104 asserts its output signal and is OFF when the secondary-side comparator 104 grounds its output signal. To respond to this digital signal transmission, the standby power system 100 includes a primary-side portion that may comprise a second comparator 156 in signal communication with a photodetector 158 of the opto-coupler 122. In this example, the photodetector 158 is a bipolar junction transistor (BJT) having a collector electrically connected to a primary-side power supply voltage $V_{DD}$ through a resistor $R_3$ and an emitter electrically connected to ground. The second comparator 156 is configured to compare a voltage at the collector of the photodetector 158 against a predetermined ON voltage ($V_{ON}$) and produce, in response, an output signal (also referred to as an enable signal EN) that is utilized to control the cycling of the power switch transistor SW. More generally, the primary-side portion of the standby power system 100 functions to detect whether a current flows through the photodetector 158.

In this example, the second comparator 156 is in signal communication with a sequential logic circuit or storage element such as, for example a set-reset flip-flop (also known as a SR flip-flop or SR latch) 170, where the output signal of the second comparator 156 drives the set terminal of the SR flip-flop 170. The second comparator 156 may be in signal communication with the SR latch via an oscillator 172, where the oscillator 172 is configured to produce a pulsed signal 174 in response to an assertion of the output signal from second comparator 156. The pulsed signal 174 drives the set input (S) of the SR flip-flop 170 to set the flip-flop 170.

A Q output 180 of the SR flip-flop 170 drives the gate of the power switch transistor SW. The power switch transistor SW is thus switched on to conduct while the SR flip-flop 170 is set. To reset the flop 170, the primary-side portion of the standby power system 100 may also comprise a third comparator 176 in signal communication with a reset input (R) of the SR flip-flop 170. The third comparator 176 is configured to compare the sense resistor voltage across the sense resistor $R_S$ against a predetermined peak current voltage reference value ($V_{ipk}$) and to produce a reset signal 178 that drives the reset input R of the SR flip-flop 170. The power switch transistor SW is thus switched off by the reset of the flop 170 when the sense resistor voltage equals Vipk.

It is appreciated by those of ordinary skill in the art that term "signal communication" refers to any type of communication and/or connection between the circuits, components, modules, and/or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical, such as, for example, conductive wires, electromagnetic wave guides, cables, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats, without passing through a direct electromagnetic connection.

Figure 1B:
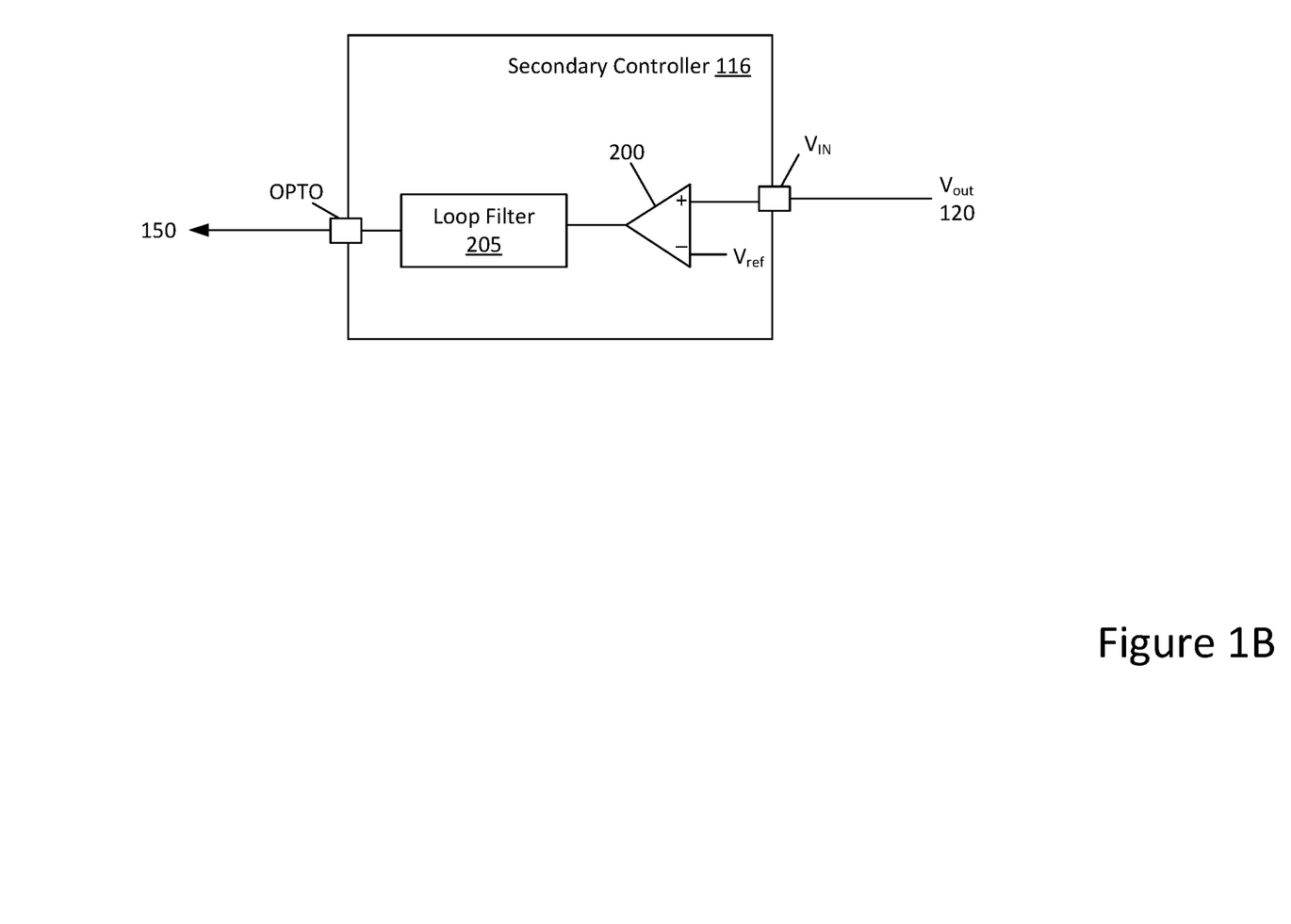
FIG. 1B illustrates a normal mode portion of a feedback loop within a secondary-side controller in accordance with an aspect of the disclosure.

A portion of the normal mode feedback loop in the secondary-side controller 116 is shown in more detail in FIG. 1B. An error amplifier 200 compares the output voltage to a reference voltage Vref to form an error signal. Whereas the output of the secondary-side comparator 104 is a digital signal, the error signal is an analog signal. A loop filter 205 filters the error signal into a control voltage that drives the opto-coupler 122. Note that the duty cycle of this control voltage is 100% such that its transmission during a conventional standby mode of operation results in a constant power consumption by the opto-coupler 122. But during the standby mode of operation disclosed herein, both the error amplifier 200 and the loop filter 205 are powered down. Secondary-side comparator 104 then controls the feedback through opto-coupler 122. Not only is the power consumption of secondary-side comparator 104 relatively low compared to the normal mode feedback loop power consumption but the duty cycle for the ON portion of the digital control signal sent through the opto-coupler 122 is close to zero such that the opto-coupler power consumption is also drastically reduced. During the normal mode of operation, the primary-side controller 114 processes the received control signal from opto-coupler 122 such as through a proportional-integral-derivative (PID) control algorithm to control the cycling of the power switch transistor SW accordingly.

Figure 2:
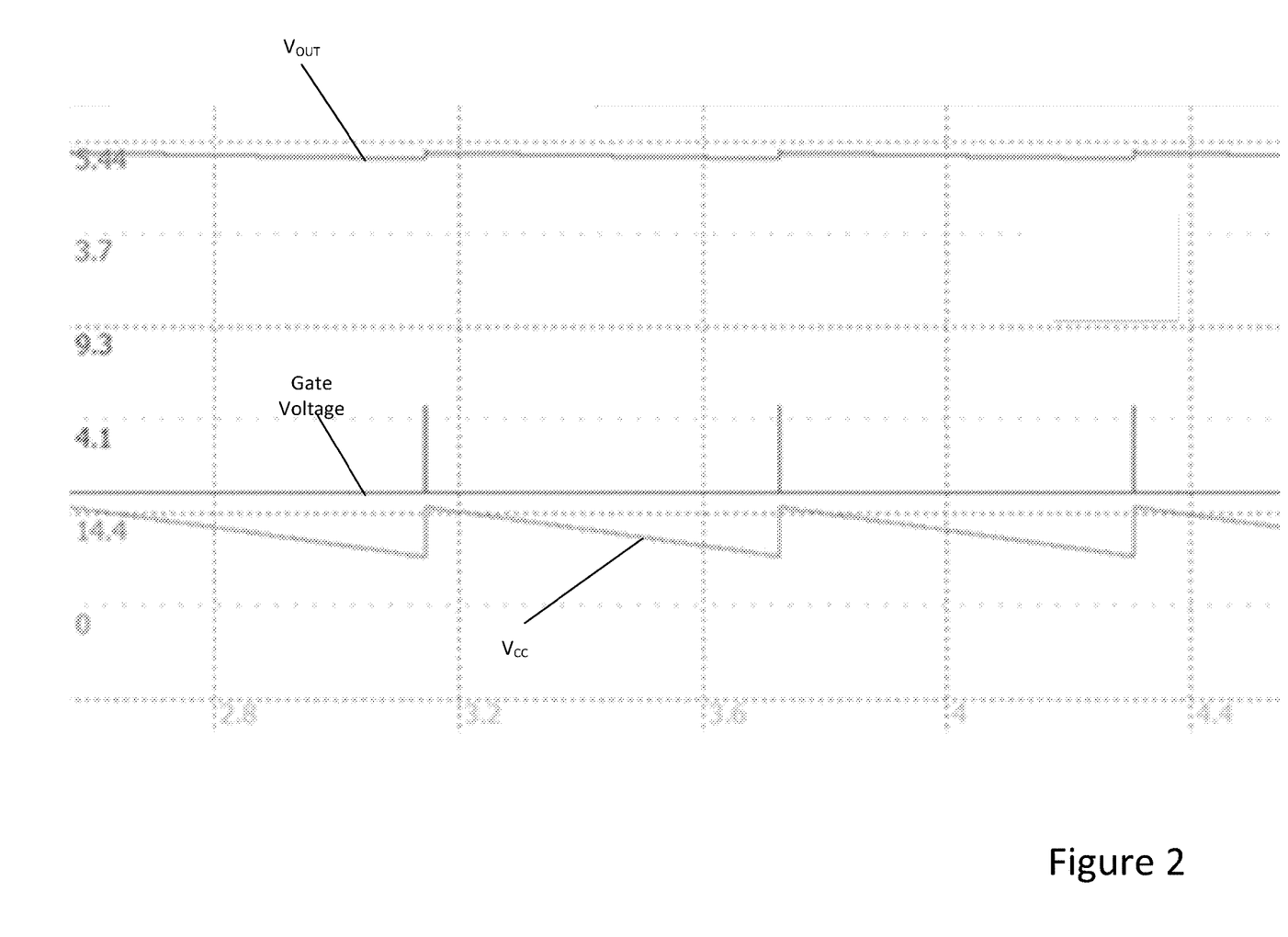
FIG. 2 illustrates some example waveforms for a flyback converter during the standby mode in accordance with an aspect of the disclosure.

Some operational waveforms for flyback converter 102 are shown in FIG. 2, including a graph of a primary-side power supply voltage VCC, the output voltage, and a gate voltage of the power switch SW during the standby mode. As will be discussed further herein, the primary-side power supply voltage VCC is produced at an auxiliary winding and filtered by a VCC capacitor that may have a significantly smaller capacitance than the capacitance for the output capacitor (e.g., 100 times smaller). The ripple in the primary-side power supply voltage VCC may thus be relatively pronounced as compared to the ripple in the output voltage. Since there is no load, the power switch transistor SW in this example is cycled approximately once every 0.5 seconds. The output voltage is then restored to the desired value (in this example, approximately 5.5 V). The output voltage then declines relatively gradually until it triggers another pulsing of the power switch transistor SW. But the power supply voltage VCC may sag several volts during this approximately 0.5 seconds of dead time from one pulse to another. The low duty cycle of the digital control signal that is transmitted through the opto-coupler 122 is evidenced by the gate voltage of the power switch transistor SW. The duty cycle in this example is approximately 300 to 400 microseconds divided by 0.5 seconds, which is remarkably low and thus reduces the opto-coupler power consumption accordingly.

Figure 3:
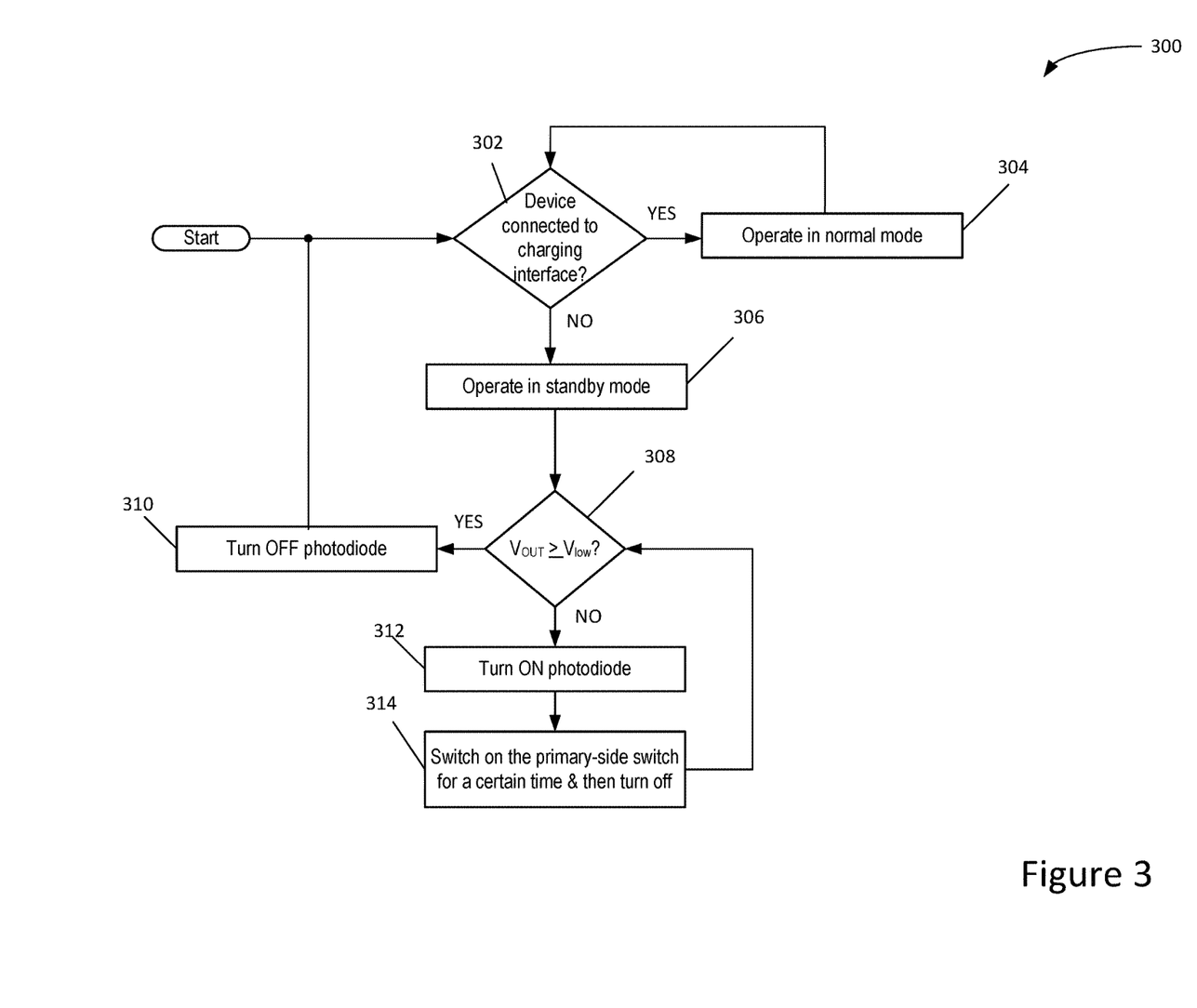
FIG. 3 illustrates a flowchart of a method performed by the standby power system shown in FIG. 1A in accordance with an aspect of the disclosure.

An example method of operation for flyback converter 102 will now be discussed with regard to the flowchart shown in FIG. 3. The method 300 starts by determining 302 whether the device 144 is electrically connected to the charging interface of the flyback converter 102. If the device 144 is electrically connected, the feedback loop discussed with regard to FIG. 1B operates in a normal mode of operation 304. In the normal mode of operation, the primary-side controller 114 and the secondary-side controller 116 are fully powered. If, instead, the device 144 is not connected to the charging interface, the method sets 306 the flyback converter 102 into the standby mode of operation in which the normal mode feedback loop is powered down. During the standby mode, the method determines in a step 308 whether the output voltage is $V_{OUT}$ greater than or equal to the threshold voltage $V_{LOW}$ and, in response, maintains 310 the photodiode current off. If $V_{OUT}$ is less than $V_{LOW}$, the method turns 312 on the photodiode current and a digital control signal is passed to the primary-side of the flyback converter 102 so that the power switch transistor SW is cycled in a step 314. The method then returns to monitoring 308 $V_{OUT}$ from the output terminal 120.

Figure 4:
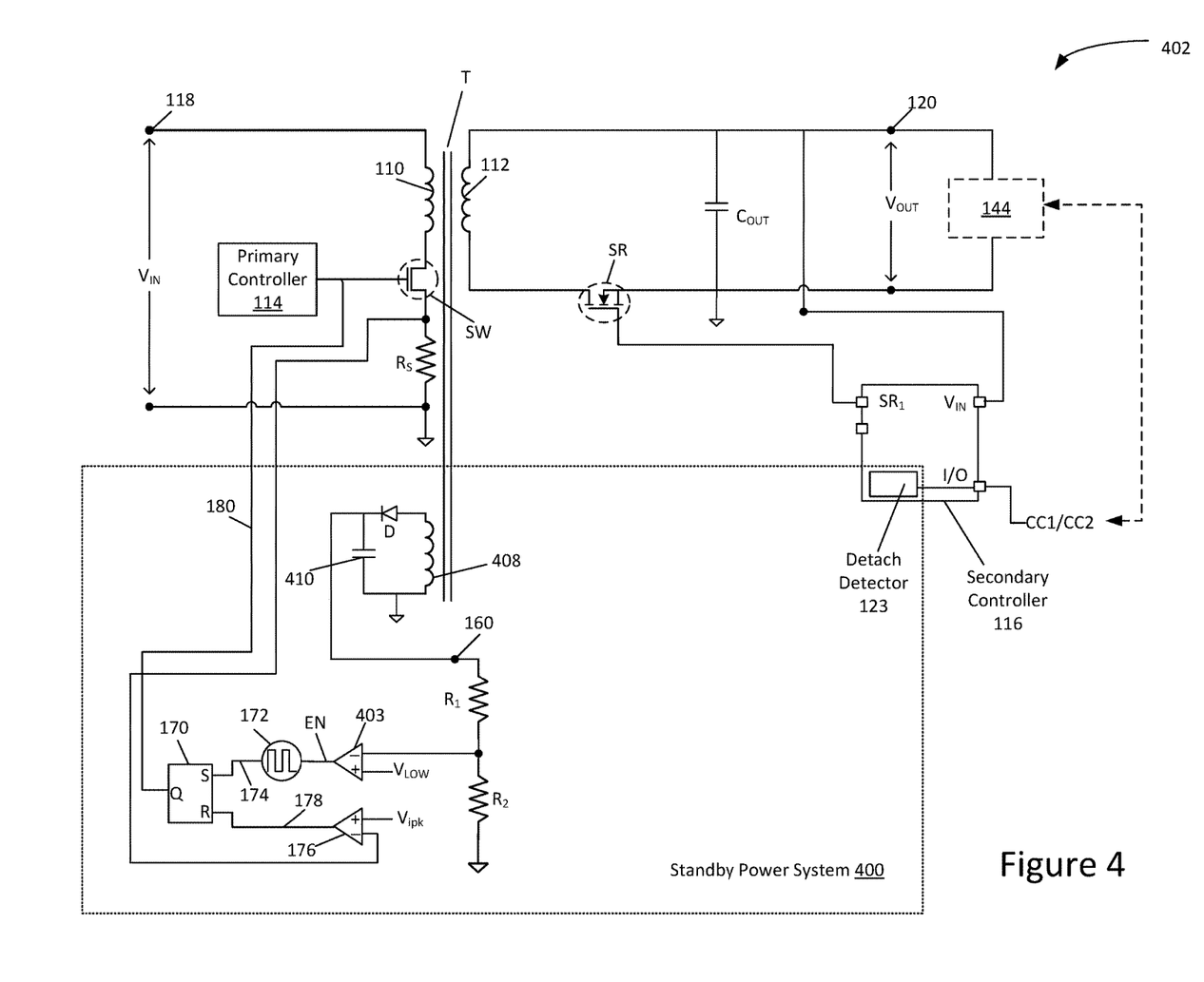
FIG. 4 illustrates a system block diagram for a flyback converter utilizing a primary-side comparator in accordance with an aspect of the disclosure.

Referring again to FIG. 2, the ripple in the primary-side power supply voltage VCC may be such that it threatens to trigger an under-voltage lockout. A standby mode of operation with a primary-side comparator 403 that monitors the primary-side power supply voltage VCC is shown in FIG. 4 for a flyback converter 402 having a standby power system 400. A primary-side comparator 403 functions analogously as discussed with regard to comparator 156 except that comparator 403 is comparing the primary-side power supply voltage VCC to a threshold voltage (VLow). For example, this comparison may be performed indirectly by using a scaled-down version of the power supply voltage such as obtained using a voltage divider formed by a first resistor $R_1$ and a second resistor $R_2$. The remainder of the primary-side portion of standby power system 400 is as discussed with regard to standby power system 100. Primary controller 114 and the primary-side portion of standby power system 400 may be deemed to form a primary-side system for flyback converter 402. Comparators 403 and 156 may be deemed to compare a feedback signal to a threshold voltage. For comparator 403, the feedback signal is the primary-side power supply voltage VCC. For comparator 156, the feedback signal is the voltage produced by received opto-coupler signal.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. Secondary-side controller for a flyback converter, comprising:
    a feedback loop configured to operate during a normal mode of operation to generate a control signal based upon an error between an output voltage for the flyback converter and a reference voltage;
    a cable detach detector configured to control the feedback loop during the normal mode of operation in response to a detection of a coupling of a device to the flyback converter and to power down the feedback loop during a standby mode of operation in response to a detection of a disconnection of the device from the flyback converter; and
    a comparator configured during the standby mode of operation to switch on a photodiode current through a photodiode in an opto-coupler in response to the output voltage being lower than a threshold voltage and to switch off the photodiode current in response to the output voltage being greater than the threshold voltage.

2. The secondary-side controller of claim 1, further comprising:
    a transistor in series with the photodiode, wherein the comparator is configured to turn on the transistor in response to the to the output voltage being lower than a threshold voltage to switch on the photodiode current.

3. The secondary-side controller of claim 1, further comprising:
    a data channel;

wherein the cable detach detector is configured to monitor the data channel to detect whether the device is disconnected from the flyback converter.

4. The secondary-side controller of claim 3, wherein the data channel is a data channel to a USB cable.

5. The secondary-side controller of claim 1, wherein the secondary-side controller includes a synchronous rectifier controller.

6. The secondary-side controller of claim 1, wherein the feedback loop includes a loop filter configured to drive the opto-coupler with the control signal during the normal mode of operation.

7. A primary-side system for a flyback converter, comprising:
  a controller configured during a normal mode of operation to process a control signal to control a cycling of a power switch transistor and configured to be powered down during a standby mode of operation; and
  a standby mode system including;
    a storage element configured to cycle on the power switch transistor in response to being set and to cycle off the power switch transistor in response to being reset;
    a first comparator configured to set the storage element in response to a feedback signal being less than a threshold voltage; and
    a second comparator configured to reset the storage element after the storage element has been set.

8. The primary-side system of claim 7, wherein the first comparator is configured to set the storage element in response to an opto-coupler current being less than a threshold current.

9. The primary-side system of claim 7, wherein the first comparator is configured to set the storage element in response to a power supply voltage being less than the threshold voltage.

10. The primary-side system of claim 7, further comprising:
  an oscillator, wherein the first comparator is configured to set the storage element by switching on the oscillator.

11. The primary-side system of claim 10, wherein the storage element is a flip-flop.

12. The primary-side system of claim 7, wherein the controller is further configured to generate the control signal using primary-only feedback.

13. The primary-side system of claim 7, wherein the controller is further configured to receive the control signal from an opto-coupler.

14. A method for powering down portions of a flyback converter having an opto-coupler in standby mode, the method comprising:
  setting the flyback converter into a standby mode in response to a device being disconnected from a charging interface to the flyback converter;
  conducting a photodiode current in an opto-coupler in response to an output voltage for the flyback converter being less than a first threshold voltage during the standby mode; and
  switching off the photodiode current while the output voltage is greater than the first threshold voltage during the standby mode.

15. The method of claim 14, further comprising:
detecting that the device is disconnected from the charging interface by monitoring a data channel in the charging interface.

16. The method of claim 14, further comprising
cycling a power switch transistor in response to the conducting of the photodiode current.

17. The method of claim 16, further including
wherein the cycling of the power switch transistor includes:
  switching on an oscillator to produce a pulsed signal at a set input of a flip-flop to set the flip-flop;
  switching on the power switch transistor in response to the set of the flip-flop;
  resetting the flip-flop in response to a sense resistor voltage exceeding a peak current voltage; and
  switching off the power switch transistor in response to the resetting of the flip-flop.

18. The method of claim 14, further comprising:
  comparing a power supply voltage to a second threshold voltage during the standby mode; and
  cycling a power switch transistor in response to the power supply voltage being less than the second threshold voltage during the standby mode.

19. The method of claim 18, wherein the cycling of the power switch transistor in response to the power supply voltage being less than the second threshold voltage during the standby mode comprises setting a flip-flop to switch on the power switch transistor.

20. The method of claim 19, wherein the setting of the flip-flop is responsive to a pulsed signal from an oscillator.

* * * * *